(12) United States Patent
Wu et al.

(10) Patent No.: US 9,978,666 B2
(45) Date of Patent: May 22, 2018

(54) METHOD FOR FABRICATION SEMICONDUCTOR DEVICE WITH THROUGH-SUBSTRATE VIA

(71) Applicant: United Microelectronics Corp., Hsinchu (TW)

(72) Inventors: Kuei-Sheng Wu, Miaoli County (TW); Ming-Tse Lin, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days. days.

(21) Appl. No.: 15/663,679

(22) Filed: Jul. 28, 2017

(65) Prior Publication Data

US 2017/0330820 A1    Nov. 16, 2017

Related U.S. Application Data

(62) Division of application No. 14/982,565, filed on Dec. 29, 2015, now Pat. No. 9,761,509.

(51) Int. Cl.

| | |
|---|---|
| *H01L 21/00* | (2006.01) |
| *H01L 23/48* | (2006.01) |
| *H01L 23/498* | (2006.01) |
| *H01L 23/532* | (2006.01) |
| *H01L 21/768* | (2006.01) |

(52) U.S. Cl.
CPC ...... *H01L 23/481* (2013.01); *H01L 21/76829* (2013.01); *H01L 21/76841* (2013.01); *H01L 21/76877* (2013.01); *H01L 21/76898* (2013.01); *H01L 23/49827* (2013.01); *H01L 23/53238* (2013.01); *H01L 2224/02372* (2013.01); *H01L 2225/06541* (2013.01)

(58) Field of Classification Search
CPC ............. H01L 21/76898; H01L 23/481; H01L 23/49827; H01L 21/76877; H01L 2224/02372

See application file for complete search history.

(56) References Cited

U.S. PATENT DOCUMENTS

| | | | |
|---|---|---|---|
| 7,531,453 B2 | 5/2009 | Kirby et al. | |
| 7,629,249 B2 | 12/2009 | Borthakur | |
| 7,683,458 B2 | 3/2010 | Akram et al. | |
| 8,956,974 B2 | 2/2015 | Huang et al. | |
| 9,741,612 B2 * | 8/2017 | Wirz | H01L 21/76897 |
| 2007/0048994 A1 * | 3/2007 | Tuttle | H01L 21/76898 |
| | | | 438/597 |

(Continued)

*Primary Examiner* — Ngan Ngo
(74) *Attorney, Agent, or Firm* — J.C. Patents

(57) ABSTRACT

A method for is used for forming a semiconductor device. The method includes forming an ILD layer on a substrate and a buffer layer on the ILD layer, wherein at least one contact is formed in the ILD layer; forming an opening through the buffer layer, the ILD layer, and the substrate; forming a liner structure layer over the substrate, wherein an exposed surface of the opening is covered by the liner structure layer; depositing a conductive material over the substrate to fill the opening; performing a polishing process, to polish over the substrate and stop at the buffer layer, wherein the liner structure layer and the conductive material remaining in the opening form a conductive via; performing an etching back process, to remove the buffer layer and expose the ILD layer, wherein a top portion of the conductive via is also exposed and higher than the ILD layer.

7 Claims, 3 Drawing Sheets

(56) References Cited

U.S. PATENT DOCUMENTS

| | | |
|---|---|---|
| 2008/0099924 A1* | 5/2008 | MacNamara ....... B81C 1/00301 257/774 |
| 2008/0284041 A1 | 11/2008 | Jang et al. |
| 2009/0261457 A1 | 10/2009 | Pratt |
| 2009/0302480 A1 | 12/2009 | Birner et al. |
| 2009/0305502 A1 | 12/2009 | Lee et al. |
| 2010/0038778 A1 | 2/2010 | Lee et al. |
| 2010/0105169 A1 | 4/2010 | Lee et al. |
| 2010/0297844 A1 | 11/2010 | Yelehanka et al. |
| 2011/0095373 A1 | 4/2011 | Hwang et al. |
| 2011/0111560 A1 | 5/2011 | Purushothaman et al. |
| 2012/0142185 A1 | 6/2012 | Park et al. |
| 2012/0214302 A1 | 8/2012 | Jeong et al. |
| 2012/0235305 A1 | 9/2012 | Kim et al. |
| 2013/0093098 A1* | 4/2013 | Yang ................. H01L 21/76898 257/774 |
| 2013/0134603 A1 | 5/2013 | Lee et al. |
| 2013/0181330 A1 | 7/2013 | Ramachandran et al. |
| 2013/0249045 A1 | 9/2013 | Kang et al. |
| 2013/0264720 A1 | 10/2013 | Chun et al. |
| 2013/0285754 A1 | 10/2013 | Chang et al. |
| 2013/0341620 A1 | 12/2013 | Birner et al. |
| 2014/0008815 A1 | 1/2014 | Park et al. |
| 2014/0015111 A1 | 1/2014 | Ho et al. |
| 2014/0077374 A1 | 3/2014 | Lin et al. |
| 2014/0084375 A1 | 3/2014 | Lee et al. |
| 2014/0084473 A1 | 3/2014 | Moon et al. |
| 2014/0162449 A1 | 6/2014 | An et al. |
| 2014/0217559 A1 | 8/2014 | Choi et al. |
| 2014/0239769 A1* | 8/2014 | Johnson ................. B06B 1/0292 310/300 |
| 2014/0264630 A1 | 9/2014 | Huang et al. |
| 2015/0028494 A1 | 1/2015 | Park et al. |
| 2015/0035150 A1 | 2/2015 | Li et al. |
| 2015/0115445 A1 | 4/2015 | Jindal et al. |
| 2015/0137388 A1 | 5/2015 | Kim et al. |
| 2015/0194345 A1 | 7/2015 | Chen et al. |
| 2015/0255529 A1 | 9/2015 | Wang et al. |
| 2016/0020145 A1 | 1/2016 | Lee et al. |
| 2016/0086874 A1 | 3/2016 | Choi et al. |
| 2016/0126173 A1 | 5/2016 | Kim et al. |
| 2016/0155686 A1 | 6/2016 | Lee et al. |
| 2017/0294352 A1* | 10/2017 | Matsuura .......... H01L 21/76898 |
| 2017/0355596 A1* | 12/2017 | Gogoi ....................... B81B 7/02 |

* cited by examiner

METHOD FOR FABRICATION SEMICONDUCTOR DEVICE WITH THROUGH-SUBSTRATE VIA

CROSS-REFERENCE TO RELATED APPLICATION

This application is a divisional application of and claims the priority benefit of U.S. application Ser. No. 14/982,565, filed on Dec. 29, 2015, now allowed. The entirety of the above-mentioned patent application is hereby incorporated by reference herein and made a part of this specification.

BACKGROUND OF THE INVENTION

1. Field of the Invention

The present invention relates to a method for forming a semiconductor device.

2. Description of Related Art

A through-substrate via (TSV), such as a through-silicon via, is a vertical electrical connection passing inter-layer dielectric (ILD) layer and through a silicon wafer or die. TSV technology is an essential structure to form a 3D circuit structure in 3D integrated circuits (IC). It provides interconnection of vertically aligned electronic devices through internal wiring that significantly reduces complexity and overall dimensions of a multi-chip electronic circuit.

A typical TSV process includes formation of TSV holes and deposition of a diffusion barrier layer and a conductive seed layer. A conductive material is then electroplated into TSV holes. Copper is typically used as the conductive material as it supports high current densities experienced at complex integration, such as 3D integrated circuits, and thereby increases device speed.

The conventional method to form the TSV usually needs to polish the deposited Cu to form the conductive seed layer in the TSV hole. However, the liner layer in the TSV hole surrounding the conductive seed layer is also polished with the Cu material. A local uneven structure caused, such as an indent, caused by the polishing process may occur on the top of the liner layer. After the conductive interconnection, such as Cu interconnection, is formed subsequently over the IDL to connect to the TSV, the local indent structure on the top of the liner layer may leave a void, resulting in poor contact to the conductive interconnection.

SUMMARY OF THE INVENTION

Accordingly, the invention is directed to a method of forming a semiconductor device having a through-substrate via in which the contact quality between the through-substrate via and the conductive interconnection can be improved.

In an embodiment of the invention, a method for forming a semiconductor device. The method comprises: providing a substrate having a front side and a back side opposite to each other; forming an inter-layer dielectric (ILD) layer on the front side of the substrate and a buffer layer on the ILD layer, wherein at least one contact is formed in the ILD layer; forming an opening, through the buffer layer, the ILD layer, and the substrate; forming a liner structure layer over the substrate, wherein an exposed surface of the opening is covered by the liner structure layer; depositing a conductive material over the substrate to fill the opening; performing a polishing process, to polish over the substrate and stop at the buffer layer, wherein the liner structure layer and the conductive material remaining in the opening form a conductive via; performing an etching back process, to remove the buffer layer and expose the ILD layer, wherein a top portion of the conductive via is also exposed and higher than the ILD layer; and forming an interconnection conductive layer over the substrate with at least a connection to the conductive via, wherein the interconnection conductive layer is in direct contact with a top surface and sidewalls of the top portion of the conductive via and with a top surface of the ILD layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
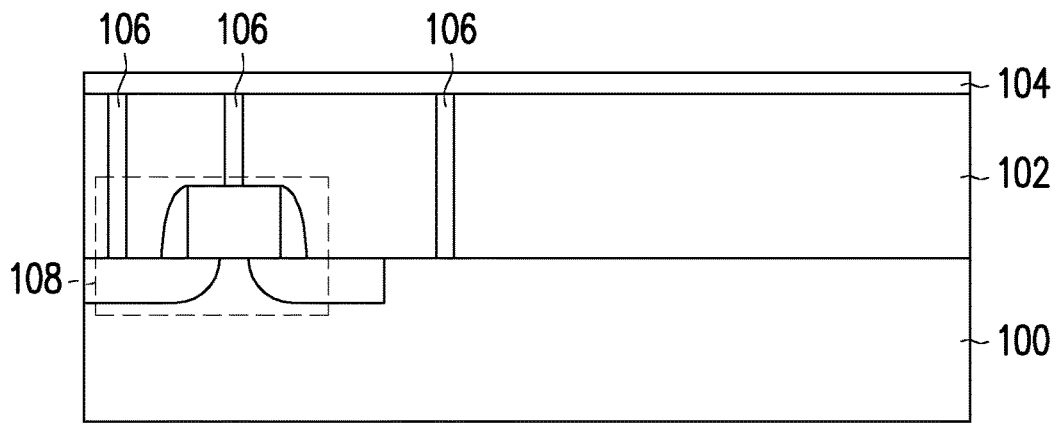
FIGS. 1A-1G are cross-sectional views, schematically illustrating the processing flow for fabrication a semiconductor device having a through-substrate via, according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

The invention is directed to a semiconductor device having a through-substrate via. When the device density in semiconductor integrated circuit is requested as higher as possible, the technology for 3D structure by using the vertical space over the wafer in the integrated circuit has been greatly developed. In order to have the interconnection in the 3D structure, the through-substrate via become an essential part for interconnection. The through-substrate via (TSV) can be the through-silicon via known in the art.

However, due to different fabrication process to form the through-substrate via, the through-substrate via would be different, in which the conventional TSV structure formed by conventional TSV process may have defect in contact between the TSV and the interconnection structure, which is subsequently formed over the ILD layer for interconnection with the TSV.

The invention as proposed can at least improve the contact between the TSV and the interconnection structure. Some embodiments are provided for descriptions but not for limitation to the invention.

FIGS. 1A-1G are cross-sectional views, schematically illustrating the processing flow for fabrication a semiconductor device having a through-substrate via, according to an embodiment of the invention. Referring to FIG. 1A, before forming the through-substrate via, some device structure has already formed over the substrate 100, such as the silicon substrate. A preliminary structure of the semiconductor device is provided as a base structure for the subsequent processes.

The preliminary structure includes an inter-layer dielectric (ILD) layer 102 formed on the substrate 100 and a buffer layer 104 formed on the ILD layer 102. Here, the ILD layer 102 indeed includes multiple sub-ILD layers to form the internal 3D structure as needed. The substrate 100 may also have doped regions for the transistor, as an example. Multiple interconnection contacts 106 have been form in the ILD layer 102. As an example, at least one interconnection contact 106 may connect to a device 108, such field effect transistor. The device 108 can be any internal device, which needs to connect to the other terminal by the interconnection contact 106, without limiting to a specific device.

Then, the buffer layer 104 is deposited on the ILD layer 102 to start the process for forming a through-substrate via. The buffer layer 104 on the ILD layer 102 may comprises buffer oxide and SiN layer as an example. A thickness of the buffer layer may be in a rage of 200 A-700 A. As a further example, the buffer oxide can be about 50 A and the SiN layer can be about 500 A, which thicknesses are not for the only limitation.

Figure 1B:
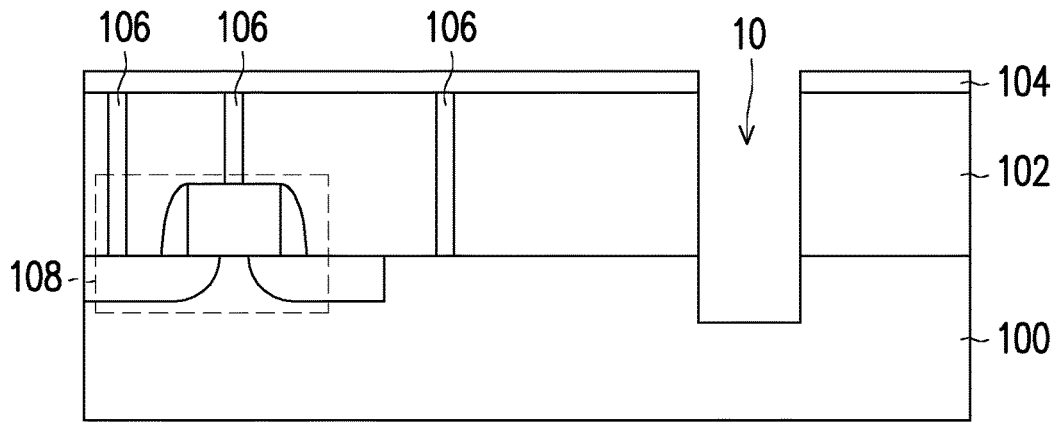

Referring to FIG. 1B, an opening 10 serving as the through-substrate hole is formed through the buffer layer 104, the ILD layer 102, and the substrate 100. The opening 10 can be formed by photolithographic and etching process as an example without limiting to a specific process. The opening 10 serving as the through-substrate hole usually beside the region where the device with interconnection contacts 106 have been formed.

Figure 1C:
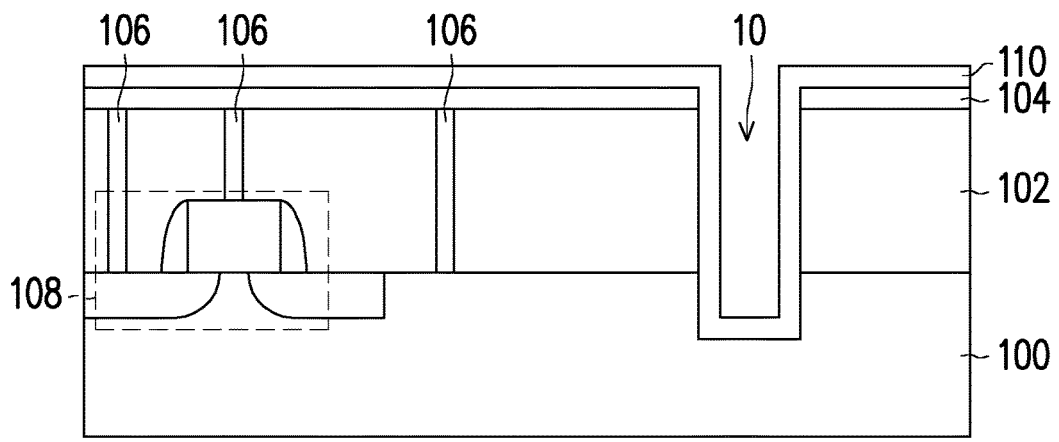

Referring to FIG. 1C, a liner structure layer 110 is deposed over the substrate 100. Usually, the liner structure layer 110 is conformal to the surface over the substrate 100. An exposed surface of the opening 10, such as the sidewall and the bottom, is at least covered by the liner structure layer 110. The liner structure layer 110 in an embodiment may also be a composite layer, such as including a liner oxide and a barrier layer.

Figure 1D:
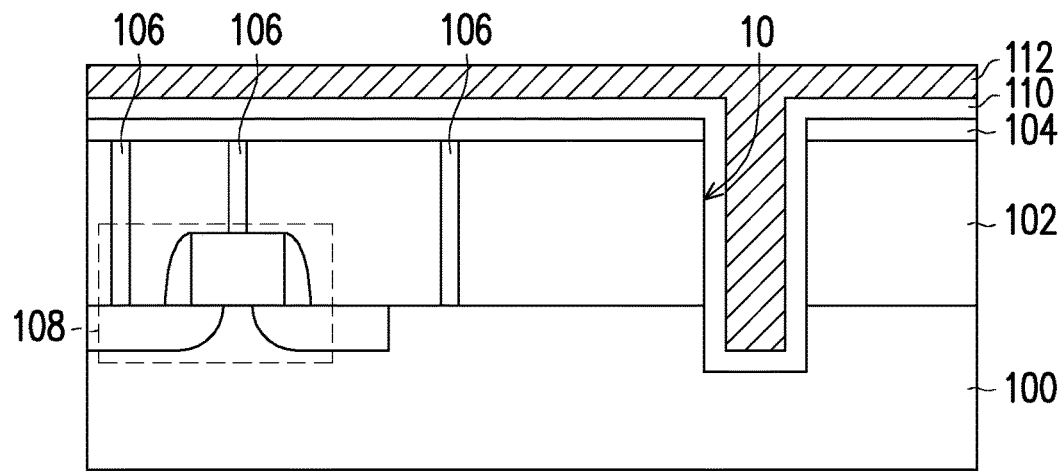

Referring to FIG. 1D, a conductive layer 112 is deposited over the substrate 100 to at least fill the opening 10. A material of the conductive layer 112 usually is copper with acceptable conductivity. However, other conductive material such as metallic material can also be taken, in other embodiment without limiting to. The portion of the conductive layer 112 filled in the opening 10 is covered by the liner structure layer 110.

Figure 1E:
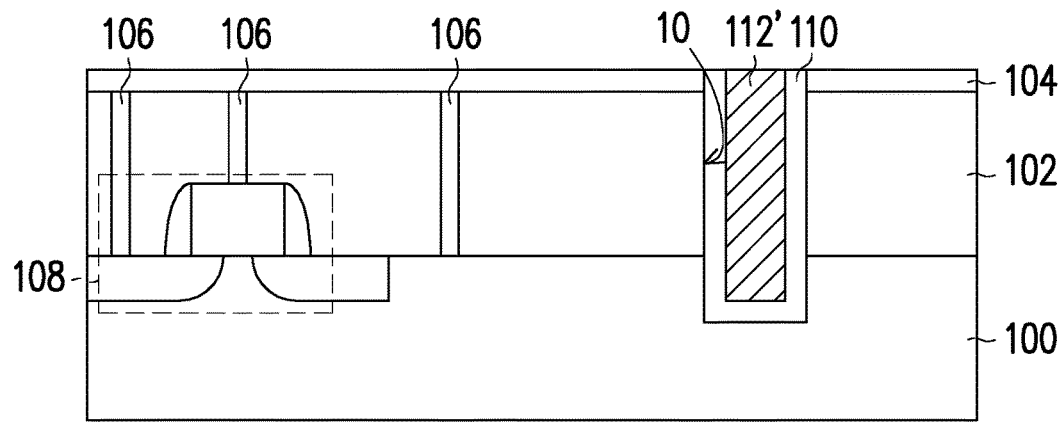

Referring to FIG. 1E, the excess material of the conductive layer 112 out of the opening 10 is removed. Usually, the excess material of the conductive layer 112 is removed by chemical-mechanical polishing (CMP) processing. The polishing process polishes the conductive layer 112 and stops at the buffer layer 104, in which the polishing process also polishes the liner structure layer 110 to expose the buffer layer 104. Referring to FIG. 1E, then, the buffer layer 104 is exposed and the remaining portion of the conductive layer 112 in the opening 10 form a conductive via 112', which includes the remaining portion of the conductive layer 112 and the liner structure layer 110 within the opening 10. The liner structure layer 110 of the conductive via 112' covers the peripheral surface within the opening 10.

Remarkably, when the horizontal portion of the liner structure layer 110 is polished away to expose the buffer layer 104, the polishing process then stops. The vertical portion of the liner structure layer 110 serving as the vertical wall of the conductive via 112' is not significantly polished. Here, the vertical wall of the liner structure layer 110 is a thin vertical wall in structure and the material of the vertical wall of the liner structure layer 110 is also different from the material of the conductive layer 112. If the polishing process keeps on polishing until the ILD layer 102 is exposed, then the conductive material of the conductive via 112' and the ILD layer 102 are usually polished more, due to different polishing rate to the vertical wall. A local indent may occur at top sidewall of the vertical wall of conductive via 112. If this indent is not solved, a void may occur between the conductive via 112' and an interconnection conductive layer, like the interconnection conductive layer 120 in FIG. 1G, resulting in poor contact. However, the polishing process in the embodiment of the invention stops at the buffer layer 104. The indent issue stated above can be significantly reduced. As a result, the contact between the conductive via 112' and the interconnection conductive layer 120 formed subsequently (seen in FIG. 1G) can be improved.

Figure 1F:
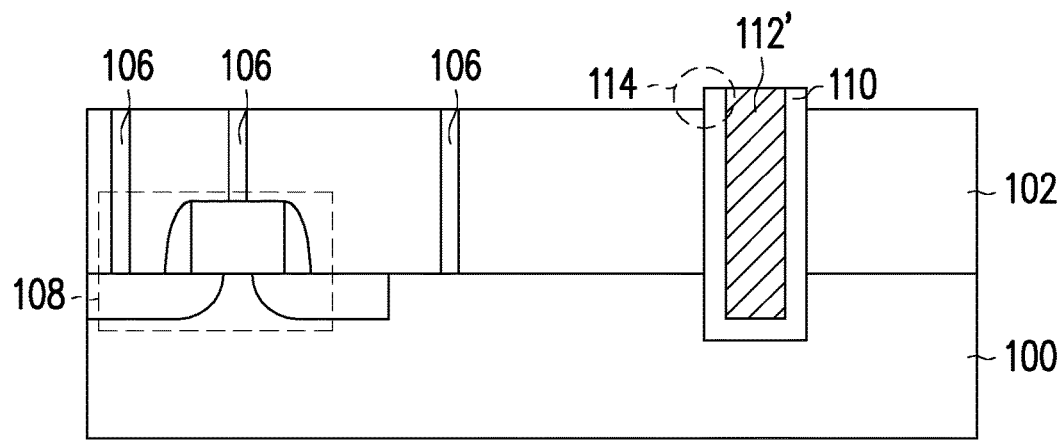

Referring to FIG. 1F, the buffer layer 104 is removed by etching back process. Depending on the thickness of the buffer layer 104, such as in a range of 200 A-700 A, the conductive via 112' is higher than the ILD layer 102. A top sidewall of the conductive via 112' at the region 114 is exposed but an indent of the conductive material of the conductive via 112' adjacent to vertical top part of the liner structure layer 110 is significantly reduced and not seen in FIG. 1F.

Figure 1G:
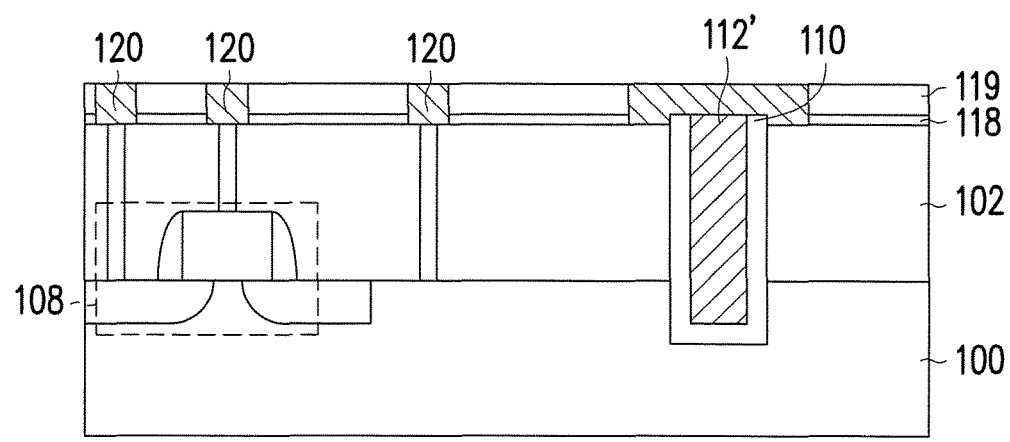

Referring to FIG. 1G, then an interconnection conductive layer 120 is further formed over the ILD layer 102 to at least connect to the conductive via 112'. In addition, the interconnection contacts 106 are also connected to the interconnection conductive layer 120 as needed based on the actual design. The interconnection conductive layer 120 may be formed by electric plating. In this embodiment as an example, before the interconnection conductive layer 120 is formed, another buffer layer 118 and another dielectric layer 119 such as low K dielectric layer are formed over the ILD layer with openings to expose the contact via 106 and the conductive via 112'. The buffer layer 118 and the dielectric layer 119 stack together as a dielectric stacked layer and can also be referred as an inter-metal dielectric (IMD) layer in another embodiment. Then, a conductive material is deposited or plated over the substrate 100 to fill the openings of the dielectric stacked layer and a polishing process is performed to polish the conductive material until the dielectric stacked layer is exposed, in which the planarity on the structure top surface can also be obtained. At this stage, the interconnection conductive layer 120 from a remaining portion of the polished conductive material is formed. In an embodiment, the interconnection conductive layer 120 may also be copper, the same as the material of the conductive via 112'.

Figure 2A:
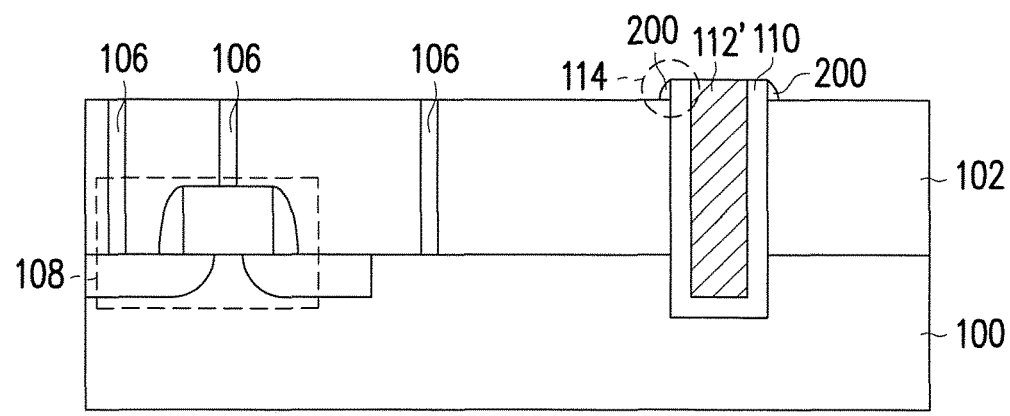
FIGS. 2A-2B are cross-sectional views, schematically illustrating the processing flow for fabrication a semiconductor device having a through-substrate via, according to an embodiment of the invention.
Figure 2B:
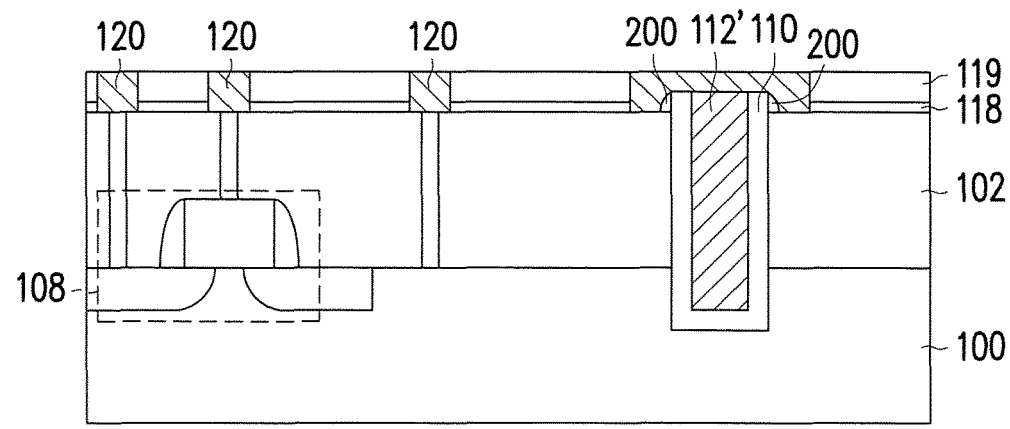

With respect to FIG. 1F, in another embodiment, a residual portion of the buffer layer may form a spacer on the sidewall of the conductive via 112' at the region 114. FIGS. 2A-2B are cross-sectional views, schematically illustrating the processing flow for fabrication a semiconductor device having a through-substrate via, according to an embodiment of the invention. The process shown in FIG. 2A and FIG. 2B can replace the process in FIG. 1F and FIG. 1G.

Referring to FIG. 2A, based on the current stage of structure in FIG. 1E under fabrication process, when the etching back process is performed on the buffer layer 104, usually a portion of the buffer layer 104 may still remain and form a spacer 200 on the top sidewall of the conductive via 112'.

Referring to FIG. 2B, like to FIG. 1G, the interconnection conductive layer 120 and an IMD layer formed from another buffer layer 118 and another dielectric layer 119 are formed over the ILD layer 102. However, the spacer 200 is covered by the interconnection conductive layer 120. Since the dielectric stacked layer from the buffer layer 118 and the dielectric layer 119 is formed, so a remaining portion of the dielectric stacked layer within the openings may also contribute to the spacer 200 no matter when the previous spacer may or may not exit. The spacer 200 may smooth the step structure and allow the interconnection conductive layer 120 to have well contact to the conductive via 112'.

After the process in FIG. 1G or FIG. 2B, some other subsequence process to further form other structure are usually performed. However, the invention can improve the quality of the through-substrate via, such as the conductive via 112', to have better connection to the interconnection layer 120. The performance of the semiconductor device can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a semiconductor device, comprising:
   providing a substrate having a front side and a back side opposite to each other;
   forming an inter-layer dielectric (ILD) layer on the front side of the substrate and a buffer layer on the ILD layer, wherein at least one contact is formed in the ILD layer;
   forming an opening, through the buffer layer, the ILD layer, and partially into the substrate;
   forming a liner structure layer over the substrate, wherein an exposed surface of the opening is covered by the liner structure layer;
   depositing a conductive material over the substrate to fill the opening;
   performing a polishing process, to polish over the substrate and stop at the buffer layer, wherein the liner structure layer and the conductive material remaining in the opening form a conductive via;
   performing an etching back process, to remove the buffer layer and expose the ILD layer, wherein a top portion of the conductive via is also exposed and higher than the ILD layer; and
   forming an interconnection conductive layer over the substrate with at least a connection to the conductive via, wherein the interconnection conductive layer is in direct contact with a top surface and sidewalls of the top portion of the conductive via and with a top surface of the ILD layer.

2. The method for forming the semiconductor device as recited in claim 1, wherein the step of performing the etching back process also forms a spacer on a sidewall of the conductive via at the top portion.

3. The method for forming the semiconductor device as recited in claim 1, wherein the liner structure layer comprises a liner oxide and a barrier layer.

4. The method for forming the semiconductor device as recited in claim 1, wherein the buffer layer on the ILD layer comprises a buffer oxide and a SiN layer.

5. The method for forming the semiconductor device as recited in claim 1, wherein a thickness of the buffer layer is 200 Å-700 Å.

6. The method for forming the semiconductor device as recited in claim 1, further comprising a circuit device connected to the contact.

7. The method for forming the semiconductor device as recited in claim 1, wherein the substrate is silicon substrate.

* * * * *